(12) United States Patent
Hongoh et al.

(10) Patent No.: US 7,018,506 B2
(45) Date of Patent: Mar. 28, 2006

(54) PLASMA PROCESSING APPARATUS

(75) Inventors: Toshiaki Hongoh, Nirasaki (JP); Naoki Matsumoto, Nirasaki (JP); Chishio Koshimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/458,239

(22) Filed: Jun. 11, 2003

(65) Prior Publication Data
US 2004/0007182 A1 Jan. 15, 2004

(30) Foreign Application Priority Data
Jul. 11, 2002 (JP) .............................. 2002-203106

(51) Int. Cl.
*C23C 16/00* (2006.01)
*H01L 21/306* (2006.01)
(52) U.S. Cl. ............... 156/345.48; 118/723 I; 118/723 AN
(58) Field of Classification Search ............ 118/723 I, 118/723 IR, 723 AN; 156/345.48, 345.49; 315/111.51
See application file for complete search history.

(56) References Cited

U.S. PATENT DOCUMENTS

| 5,904,780 | A | * | 5/1999 | Tomoyasu | ............ 118/723 AN |
| 5,916,455 | A | * | 6/1999 | Kumagai | ...................... 216/68 |
| 2002/0139480 | A1 | * | 10/2002 | Nakajima | .............. 156/345.48 |

FOREIGN PATENT DOCUMENTS

| JP | 9-115694 A | | 5/1997 |
| JP | 2000-173985 | * | 6/2000 |
| JP | 2000-173985 A | | 6/2000 |
| JP | 2001-28299 A | | 1/2001 |
| JP | 2001-210628 A | | 8/2001 |
| JP | 2002-190473 A | | 7/2002 |
| WO | WO 00/40771 A1 | | 7/2000 |

* cited by examiner

*Primary Examiner*—Luz Alejandro-Mulero
(74) *Attorney, Agent, or Firm*—Crowell & Moring LLP

(57) ABSTRACT

A plasma processing apparatus comprises a plate that separates a high frequency induction antenna from a vacuum chamber. The plate comprises a nonmagnetic metal plate that has an opening and a dielectric material member that seals the opening. The area of the nonmagnetic metal plate is larger than the area of the dielectric material member.

9 Claims, 5 Drawing Sheets

PRIOR ART

PLASMA PROCESSING APPARATUS

BACKGROUND OF THE INVENTION

1. Field of the Invention

The present invention relates to a plasma processing apparatus and, more particularly, to an inductively coupled plasma processing apparatus.

2. Description of the Related Art

An inductively coupled plasma processing apparatus comprises a vacuum chamber in which a workpiece to be processed is placed on a susceptor and a high frequency induction antenna that is placed outside of the chamber in the atmosphere. When gas is supplied into the vacuum chamber and at the same time an electromagnetic field generated by currents through the induction antenna is applied to the gas, the gas is ionized or becomes a gas plasma. The gas plasma is used for deposition or etching processes on the workpiece such as a semiconductor wafer, or a glass substrate, to be processed.

Conventionally a plate such as a wall or a part of the wall that separates the induction antenna from the vacuum chamber was made of dielectric material plate in order to effectively produce an electromagnetic field in the vacuum chamber. Therefore, when the plasma is produced, a high voltage is applied between both sides of the dielectric material plate. A surface of the dielectric material plate that faces the vacuum chamber is hit by ions that are accelerated by the high voltage. The dielectric material plate is damaged through the ion attack. The ions can sputter the dielectric material plate and unwanted contaminations can be produced.

In recent years it has been necessary to use a large vacuum chamber and induction antenna in order to extend the area of the plasma for large workpieces. The dielectric material plate also became larger. It is difficult to make such a large dielectric material plate because the large dielectric material plate is fragile.

SUMMARY OF THE INVENTION

An object of the present invention is to provide a plasma processing apparatus comprising a plate that cannot be damaged by ion attack and can be made easily.

A first aspect according to the present invention is to provide a plasma processing apparatus comprising a vacuum chamber in which a workpiece to be processed can be arranged, a high frequency induction antenna that is arranged outside the vacuum chamber and a plate that is arranged between the induction antenna and the vacuum chamber, said plate comprising a nonmagnetic metal body that has an opening and a dielectric material member that seals the opening, wherein the area of said a nonmagnetic metal body is larger than the area of said dielectric material member.

A second aspect according to the present invention is to provide a plate for a plasma processing apparatus that is arranged between a high frequency induction antenna and a vacuum chamber where a work to be processed can be arranged, said plate comprising a nonmagnetic metal body that has an opening and a dielectric material member that seals the opening, wherein the area of said a nonmagnetic metal body is larger than the area of said dielectric material member.

BRIEF DESCRIPTION OF THE DRAWINGS

The above object and the features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and disadvantages therein will be described with reference to the related figures.

Figure 8:
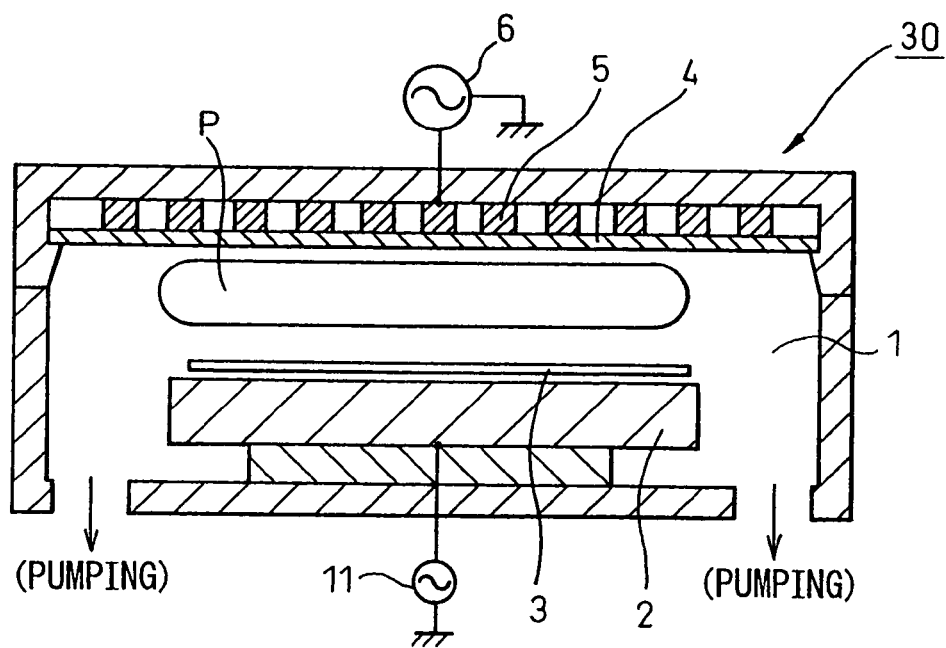
FIG. 8 shows a conventional plasma processing apparatus.

A conventional plasma processing apparatus, as shown in FIG. 8, comprises a vacuum chamber 1 and an induction antenna 5 outside of the vacuum chamber 1. The vacuum chamber 1, which is generally made of aluminum, comprises a susceptor 2. A workpiece 3 to be processed, for example, a semiconductor wafer or a glass substrate, is placed on the susceptor 2. The susceptor 2, if desired, is connected to a high frequency bias power source 11. An induction antenna 5, which is spiral, is connected to a high frequency power source 6 for generating plasma P. A plate 4 between the antenna 5 and the vacuum chamber 1 is a dielectric material plate such as alumina or silica glass. The dielectric material plate 4 is also a wall that can separate vacuum space and atmospheric space. The vacuum chamber 1 also comprises a gas supply unit and a vacuum pumping unit, and so on, not shown in the figures.

A plasma process is performed with the plasma processing apparatus 30 as follows. First, a workpiece 3 to be processed is placed on the susceptor 2 in the vacuum chamber 1. Next, the vacuum chamber 1 is kept at a low pressure by using the vacuum pumping unit and the gas to be ionized is introduced through a gas pipe from the gas supply unit. Then, the gas plasma P is produced by an electromagnetic field generated by current through the induction antenna 5. The gas plasma is used for plasma processing, such as plasma deposition/etching processing, on the workpiece.

As described above, a high voltage is applied between both sides of the dielectric material plate 4 that is a wall of the vacuum chamber. Therefore the side of dielectric material plate 4 in the vacuum chamber 1 can be damaged through an ion attack. Contamination can be emitted from the plate 4 by the ion attack.

In the following, embodiments according to the present invention will be described with reference to the appended drawings, in which like numerals represent like elements throughout figures.

Figure 1A:
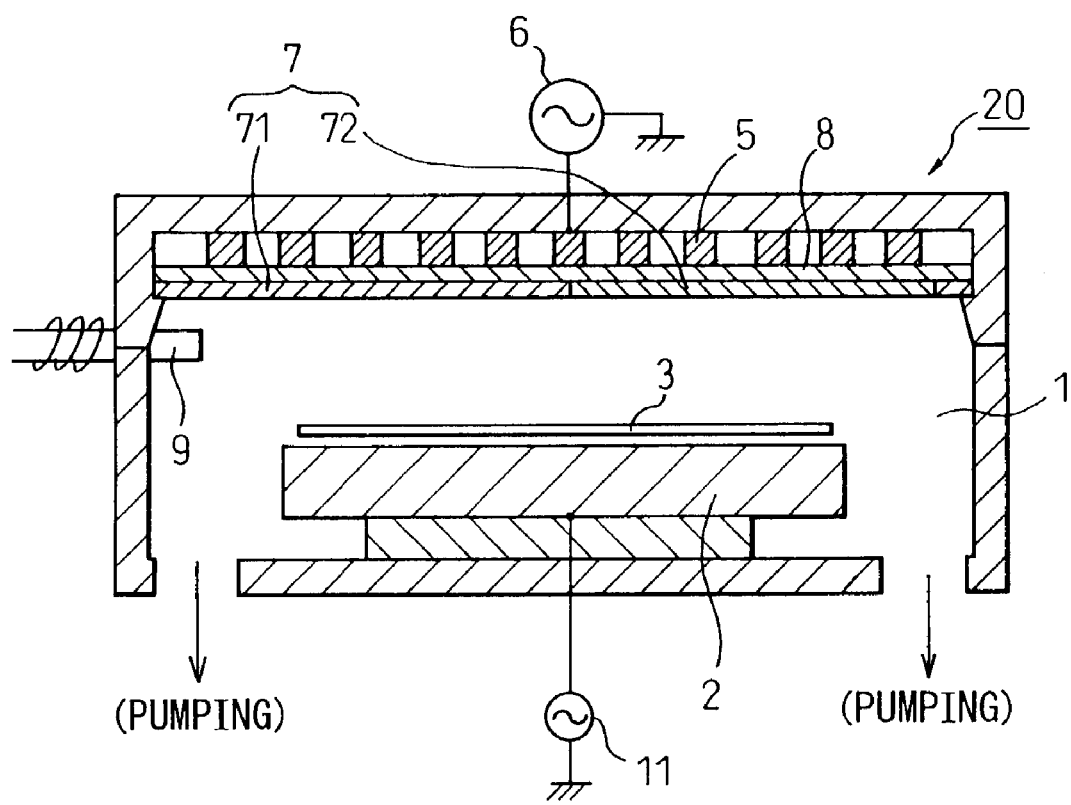
FIG. 1A shows an embodiment of a plasma processing apparatus according to the present invention.

According to the present invention, as shown in FIG. 1A, a plasma processing apparatus 20 comprises a vacuum chamber 1 and a spiral induction antenna 5. The vacuum chamber 1 has a susceptor 2, on which is placed a workpiece such as a semiconductor wafer or a glass substrate to be processed.

The antenna 5 is arranged outside the vacuum chamber and opposite the susceptor 2. The antenna 5 is connected to a high frequency power source 6. The susceptor 2 can be connected to a high frequency bias power source 11.

Figure 1B:
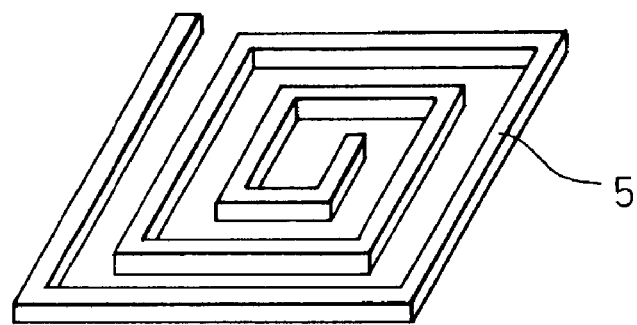
FIG. 1B shows an example of a high frequency induction antenna according to the present invention.

As shown in FIG. 1B, the spiral induction antenna 5 has a square form. Generally the form of the spiral antenna corresponds to the form of the vacuum chamber or a workpiece to be processed. Therefore the form of the spiral antenna for treating a semiconductor wafer may be circular.

According to the embodiment, the plate 7 that separates the induction antenna 5 from the vacuum chamber 1 comprises a nonmagnetic metal body 71 that comprises a dielectric material member 72. A plasma torch 9 is arranged as an ignition device in the vacuum chamber.

Figure 2:
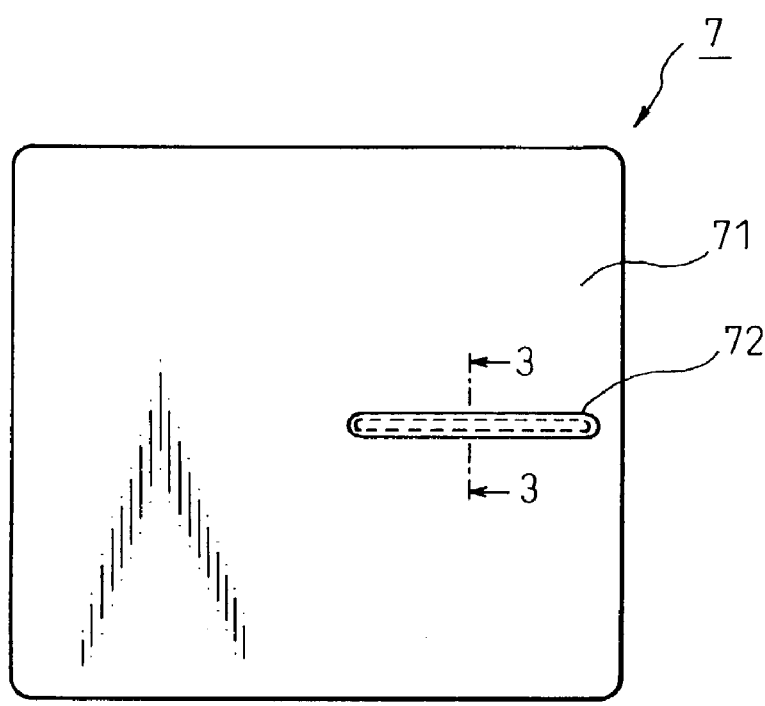
FIG. 2 shows an example of a plate that is a nonmagnetic metal body with a dielectric material member according to the present invention.

FIG. 2 shows an illustrative plate according to the embodiment of the invention. The plate 7 consists of the nonmagnetic metal body 71 and the dielectric material member 72. The dielectric material member fits into a slit and seals the vacuum. The slit is cut from the center to the rim of the nonmagnetic metal body 71. The slit is approximately rectangular in shape in FIG. 2. However the shape of the slit is not limited to this shape. The slit may be sectional or trapezoidal in shape, so long as the slit is long and narrow.

Figure 3:
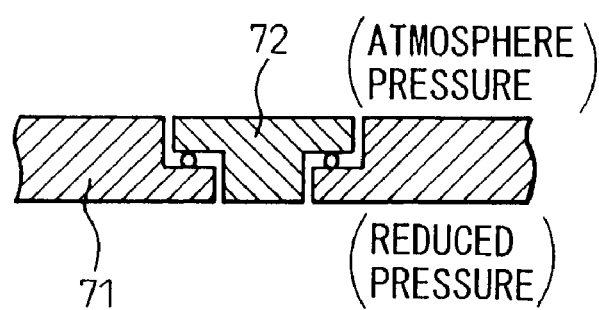
FIG. 3 shows a partial cross section of the plate in FIG. 2.

A partial cross section of the plate 7 is shown in FIG. 3. FIG. 3 schematically shows the atmosphere over the plate 7 and the vacuum under the plate. The cross-sectional shape of the dielectric material member 72 is formed with, for example T-shaped. The dielectric material member 72 is inserted into the slit and is placed, with an O-ring, on the protrusion on the lower part of the slit. As a result, the dielectric material member 72 is depressed and fixed by the pressure difference. The dielectric material member 72 can prevent eddy currents being induced on the surface of the nonmagnetic metal body.

Figure 4:
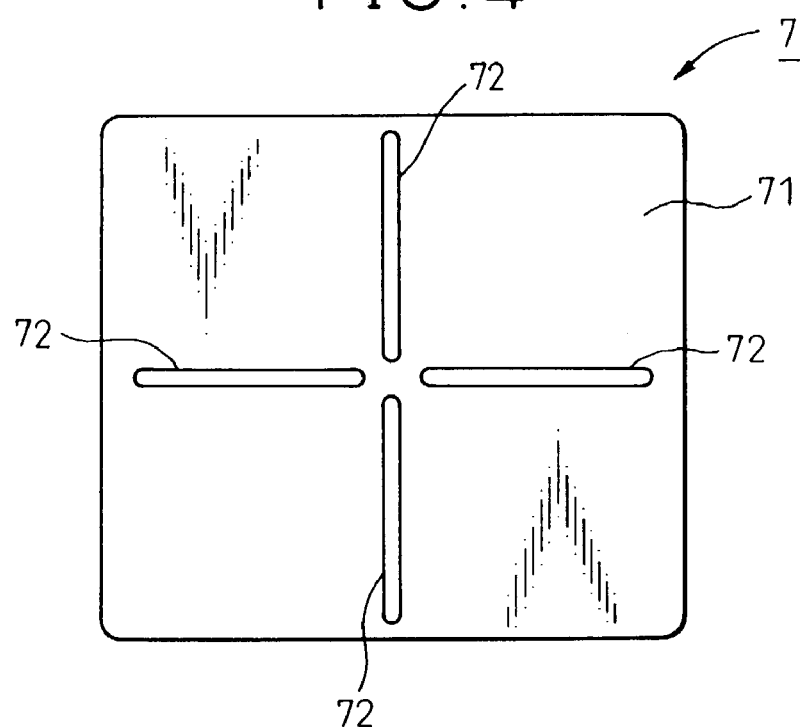
FIG. 4 shows a second example of the plate that is a nonmagnetic metal body with dielectric material members.

FIG. 4 shows a second example of the plate 7. The plate 7 has a number of slits that are placed symmetrically. A number of dielectric material members 72, for example four members, can be arranged to seal the slits. Thus the induction of eddy currents can be prevented more effectively.

As mentioned above, according to the invention, the plate is the nonmagnetic metal body of which the slit is sealed by the dielectric material. The plate can be made easily and at lower price than a dielectric material plate. The plate can effectively act as a Faraday shield. The Faraday shield can reduce the capacitance-coupling effect between the antenna and the plasma in the vacuum chamber. Even if the plate is attacked by ions in the plasma, the contamination is no longer sputtered from the nonmagnetic metal body. Furthermore the slit that is sealed by the dielectric material is practically orthogonal to the antenna. The dielectric material can effectively prevent the induction of eddy currents and a waste of energy in the electromagnetic field.

In addition, insulating members 8 such as glass are arranged between the induction antenna 5 and the metal body 71. The insulating members 8 are used as spacers to prevent contact between the induction antenna 5 and the metal body 71. The insulating members are not restricted in shape and can be placed at appropriate locations.

Figure 5:
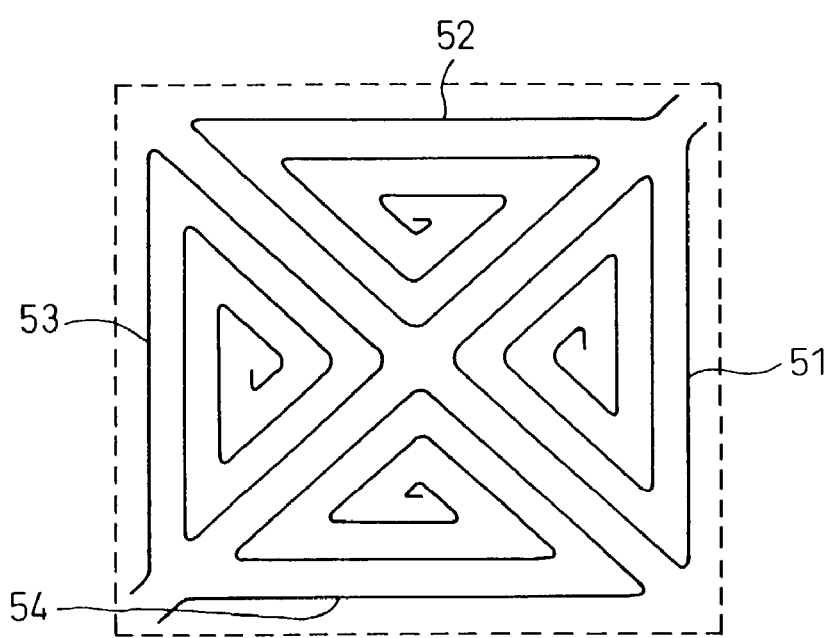
FIG. 5 shows an example of divided induction antennas.
Figure 6:
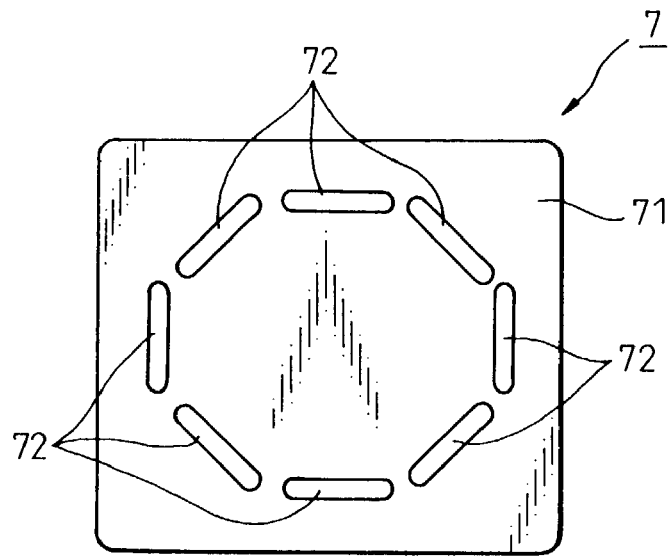
FIG. 6 shows a third example of a plate that is a nonmagnetic metal body with dielectric material members.

Currently, workpieces to be processed have become large. Thus a large vacuum chamber and a large induction antenna become necessary. If the large induction antenna is made by winding a coil, the inductive component of the antenna can become large and a high voltage is needed to drive the antenna. Several divided antennas can be provided in order to avoid such problems. For example, as shown in FIG. 5, four divided antennas 51–54 can be used. The slits of the nonmagnetic metal body can be cut as shown in FIG. 6 and can be sealed by the dielectric material member as shown in FIG. 3. Some dielectric material members that are orthogonal to the induction antenna can effectively prevent the induction of eddy currents.

In this case the forms of the slit and the dielectric material member may be substantially the same as those shown in FIG. 3. Generally, however, a person with ordinary skill in the art can appropriately use any slit-shape, slit-location, slit-number and dielectric material member. However, it is necessary that the area of dielectric material members is not larger than the area of the nonmagnetic metal.

The susceptor 3 is opposed to the metal body 71. Therefore, the high frequency bias voltage applied to the susceptor 3 by a high frequency source 11 can be decreased. The decreased power allows plasma processing substantially the same as the conventional art.

However, the fact that the metal body 71 faces the susceptor 3 may prevent plasma ignition. In order to ignite the gas into plasma, it is necessary, in general, that the induction antenna 5 and the susceptor 3 can be operated in a parallel plate mode. In the present embodiment, the metal body 71 is between the induction antenna 5 and the susceptor 3. Therefore the induction antenna 5 and the susceptor 3 cannot be in the parallel plate mode. In such case the gas cannot be ignited to a plasma due to the lack of the necessary electromagnetic field.

A plasma torch 9 can be provided in the vacuum chamber in order to ignite the gas into the plasma. The plasma torch 9 comprises multiple tubes where a gas is supplied through the center tube thereof and a wire antenna is wound outside. The plasma torch 9 can generate the gas plasma by high frequency current in the wire antenna and can blow flames into the chamber. The plasma torch 9 can ignite the gas into plasma even if the nonmagnetic metal plate is used in the vacuum chamber. In addition, when the gas is ignited into plasma, the high frequency electromagnetic field due to the induction antenna 5 can maintain the plasma without the plasma torch.

A plasma ignition means other than the plasma torch can be used. For example, a pressure increase in the vacuum chamber can ignite the gas into plasma. Further a bias source for plasma ignition can be used to apply the voltage to the gas in the vacuum chamber. Furthermore light from an ultraviolet source can irradiate the gas to become a plasma.

A spark plug can be generally used as plasma ignition means. However when it sparks, contamination is likely to be generated in the vacuum chamber. Therefore the spark plug may be inadequate for the present invention.

Figure 7:
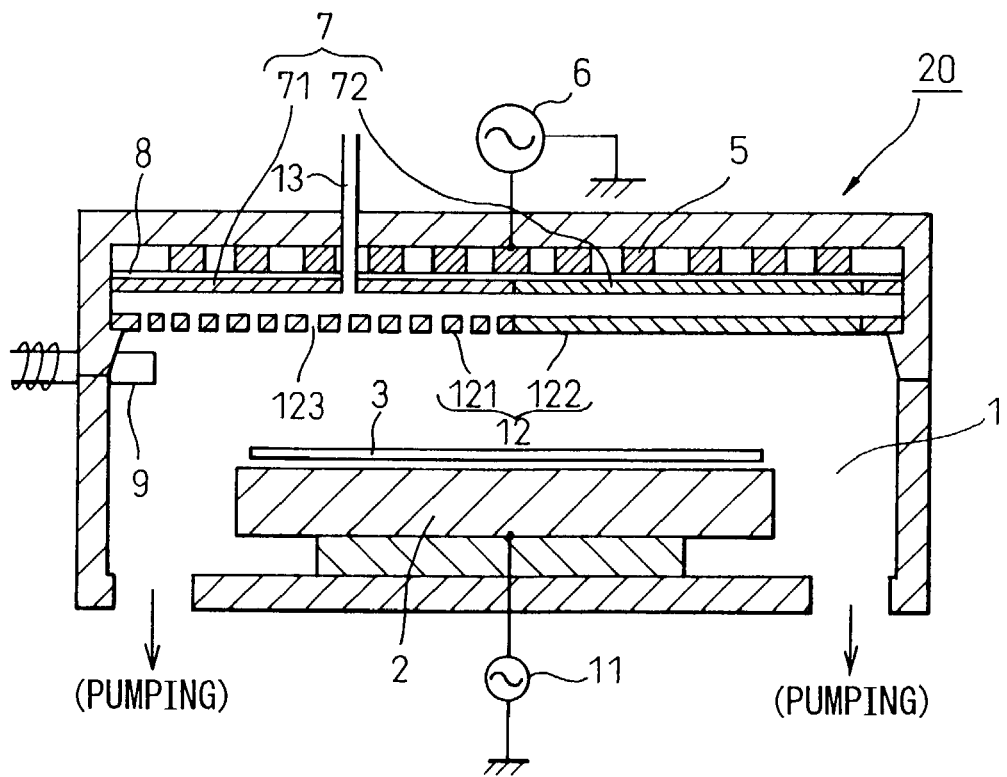
FIG. 7 shows another embodiment of a plasma processing apparatus according to the present invention.

FIG. 7 shows another embodiment according to the invention. A plasma processing apparatus 20 comprises two plates 7, 12. The first plate 7 is the same as in the first embodiment and the second plate 12, which faces a susceptor 2, has many holes in the metal body 123. The gas is supplied into the space between the first plate 7 and the second plate 12 through gas supply pipe 13.

In more detail, the second plate 12 is arranged in front of a first plate 7 in a vacuum chamber. The first plate 7 has a nonmagnetic metal body 71 with a dielectric material member 72. The second plate 12 has a nonmagnetic metal body 121 with a dielectric material member 122. The nonmagnetic metal body 121 has many holes that pass through to the other side. A gas supply pipe 13 is arranged between the first plate 7 and the second plate 12.

While gas is supplied between the first plate 7 and the second plate 12 through the gas supply pipe, current in an induction antenna can generate an electromagnetic field. The gas can be effectively ionized and becomes a plasma due to the electromagnetic field. The gas plasma can blow out like a shower into the vacuum chamber through many holes of the second plate 12. The gas shower can operate in a similar way on any of the surface areas of the workpiece to be processed.

As the metal body of the plate can be worked easily, it is easy to make the plate with many through holes. Thus the gas shower structure, for the wafer or the substrate to be processed, can be made easily.

As described above, according to the present invention, the plate that separates the induction antenna from the vacuum chamber comprises the nonmagnetic metal plate of which a slit is sealed with the dielectric material member. The nonmagnetic metal plate, which can be made easily, cannot be damaged by ion attack. Further, the dielectric material member in the slits can prevent eddy currents being induced on the metal plate.

If a plasma ignition means is arranged in the vacuum chamber, the gas plasma is easily generated.

If a nonmagnetic metal plate with plural holes is used, the plate can be used as a showerhead through which a gas is sprayed.

Furthermore, a metal plate is opposite the susceptor. Therefore a high frequency bias voltage is easily applied to the susceptor. The plasma processing according to the invention uses less power but the process has a throughput nearly equal to a conventional art.

What is claimed is:

1. A plasma processing apparatus, comprising:
    a vacuum chamber in which a workpiece to be processed can be arranged;
    a first plate, which forms an upper part of the vacuum chamber and comprises a first nonmagnetic metal body that has a first opening and a first dielectric material member that seals the first opening, wherein the area of the first nonmagnetic metal body is larger than the area of the first dielectric material member;
    a high frequency induction antenna, which is disposed outside the vacuum chamber and arranged over the first plate; and
    a second plate spaced from and facing the first plate, comprising a second nonmagnetic metal body that has a second opening and a second dielectric material member that seals the second opening;
    wherein the area of the second nonmagnetic metal body is larger than the area of said second dielectric material member; and
    wherein the second nonmagnetic metal body includes a plurality of holes, so that the second plate forms a showerhead with the first plate.

2. The apparatus according to claim 1, wherein plasma ignition means is included in said vacuum chamber.

3. The apparatus according to claim 1, wherein said first opening of the first nonmagnetic metal body is a slit.

4. The apparatus according to claim 3, wherein said first dielectric material member is orthogonal to said induction antenna.

5. The apparatus according to claim 3, wherein said first dielectric material member seals the slit.

6. The apparatus according to claim 3, wherein said first dielectric material member seals the slit by differential pressure between the chamber and the outside of the chamber.

7. The apparatus according to claim 1, wherein a plurality of dielectric material members are arranged corresponding to a plurality of openings of the first nonmagnetic metal body.

8. The apparatus according to claim 1, including a plurality of said induction antennas.

9. The apparatus according to claim 1, wherein insulating members are arranged between said induction antenna and said first nonmagnetic metal plate.

* * * * *